United States Patent [19]

Kamakura et al.

[11] Patent Number: 5,760,423

[45] Date of Patent: Jun. 2, 1998

[54] SEMICONDUCTOR LIGHT EMITTING DEVICE, ELECTRODE OF THE SAME DEVICE AND METHOD OF MANUFACTURING THE SAME DEVICE

[75] Inventors: Takanobu Kamakura; Tsuguo Uchino, both of Kitakyushu, Japan

[73] Assignee: Kabushiki Kaisha Toshiba, Kawasaki, Japan

[21] Appl. No.: 746,349

[22] Filed: Nov. 8, 1996

[51] Int. Cl.[6] ........................ H01L 33/00
[52] U.S. Cl. ........................ 257/99; 257/81
[58] Field of Search ................ 257/81, 99, 95

[56] References Cited

U.S. PATENT DOCUMENTS 5,369,289  11/1994  Tamaki et al. ............ 257/99
5,373,175  12/1994  Ozawa et al. ............. 257/99
5,506,451  4/1996   Hyugaji .................. 257/81
5,523,591  6/1996   Fleming et al. .......... 257/99
5,661,313  8/1997   Dubbelday et al. ........ 257/99

FOREIGN PATENT DOCUMENTS

6-314822  11/1994  Japan.

Primary Examiner—Mahshid D. Saadat
Assistant Examiner—S. V. Clark
Attorney, Agent, or Firm—Foley & Lardner

[57] ABSTRACT

A semiconductor light emitting device has a structure of stacked semiconductor layers including a double hetero junction, and a electrode having a plurality of stacked metal layers exhibiting a light transmitting property and an oxygen rich layer exhibiting the light transmitting property and interposed between said metal layers. The oxygen rich layer is preferably oxide layer. Such structure exhibits high light emission.

24 Claims, 11 Drawing Sheets

SEMICONDUCTOR LIGHT EMITTING DEVICE, ELECTRODE OF THE SAME DEVICE AND METHOD OF MANUFACTURING THE SAME DEVICE

BACKGROUND OF THE INVENTION

1. Field of the Invention

The present invention relates to a semiconductor light emitting device, a structure of an electrode employed as an ohmic electrode thereof, and a method of manufacturing the semiconductor light emitting device.

2. Description of the Background Art

Figure 1:
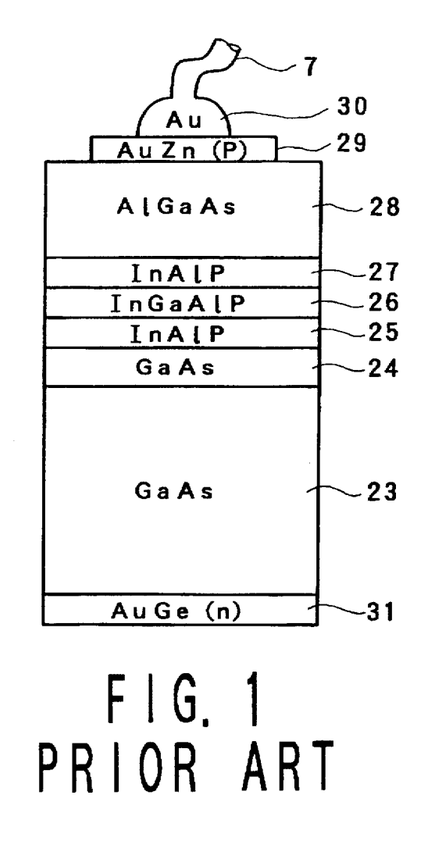
FIG. 1 is a sectional view showing one example of a structure of a prior art semiconductor light emitting device.
Figure 2:
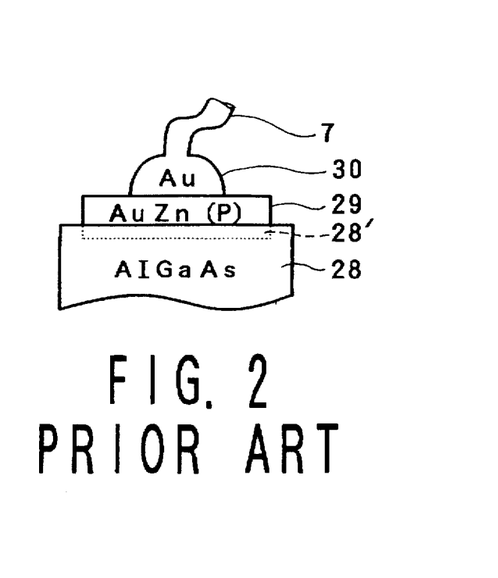
FIG. 2 is a sectional view illustrating a construction of an uppermost portion in a structure of a conventional electrode.

FIG. 1 shows an example of an ohmic electrode structure in a conventional semiconductor device. Referring to FIG. 1, a GaAs buffer layer 24 of the same conductivity type as a p or n type GaAs substrate 23 is provided on this substrate 23. Stacked on this buffer layer 24 are an InAlP layer 25, an InGaAlP layer 26, an InAlP layer 27, an AlGaAs layer 28 and an AuZn layer 29 in this sequence. Thus constructing a double hetero structure. An Au wire 7 is bonded onto the AuZn layer 29 defined as an uppermost layer by an Au ball 30. An upper electrode is constructed of the AuZn layer 29 and the Au ball 30. A boundary between the AlGaAs layer 28 and the AuZn layer 29 is formed with an alloy diffusion layer 28'. Further, the lower electrode is formed of an AuGe layer 31.

Herein, the AuZn layer 29 contains several % of Zn, and the AuGe layer 31 contains several % of Ge. Each of these layers 29, 31 is formed in thickness of 1-3 μm. As a metal contained in Au, Be is conceived standard.

Figure 3:
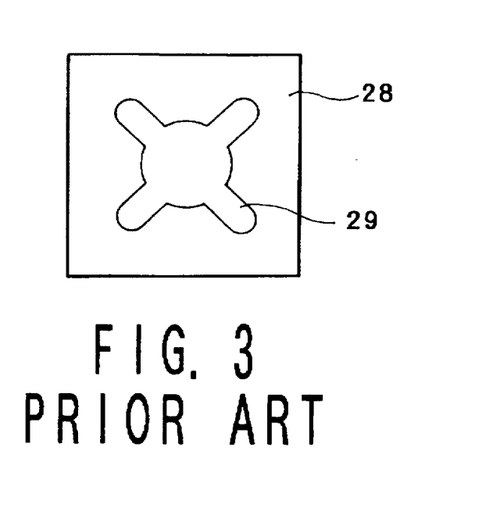
FIG. 3 is a plan view showing a configuration of the conventional electrode.

The AuZn layer 29 constituting the upper electrode is subjected to patterning in a cross-shape as illustrated in FIG. 3. This intends to prevent a luminance from being reduced because of the fact that the light emitted from an active layer is intercepted by the AuZn layer, and to increase a peripheral length of the electrode occupying a pellet as much as possible.

An ohmic connection is provided in this metal electrode, and it is therefore desirable that annealing be carried out (see. e.g. Japanese Patent Laid-Open Publication NO.6-314822).

Figure 4:
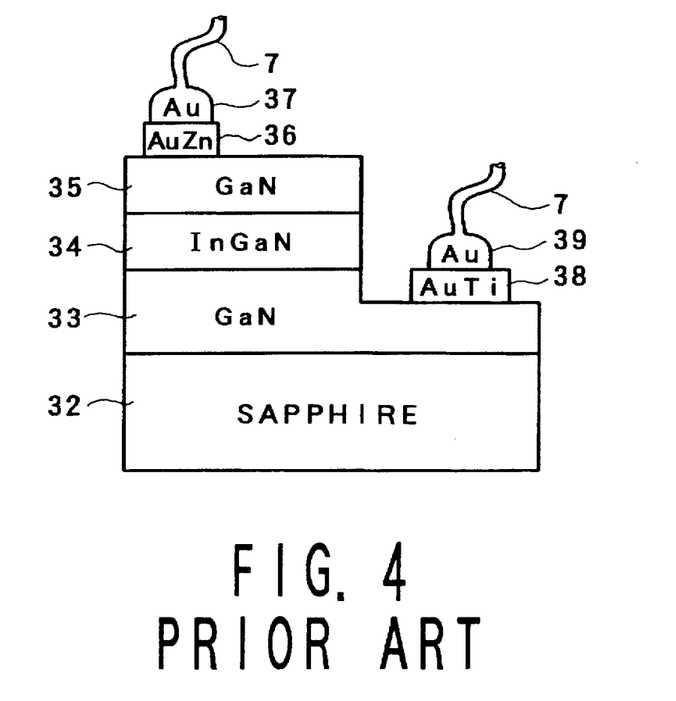
FIG. 4 is a sectional view showing another example of a conventional semiconductor light emitting device.

Next, FIG. 4 shows another background art. What is illustrated herein is a structure in which two electrodes are provided on the same surface of the substrate. A GaN layer 33 is grown on a sapphire substrate 32. Stacked on the GaN layer 33 are an InGaN layer 34, a GaN layer 35, an AuZn layer 36 in tis sequence, and an Au wire 7 is bonded onto the AuZn layer 36 by an Au ball 37. An AuTi layer 38 is further deposited on a part of the GaN layer 33, and an Au wire 7 is bonded to the AuTi layer 38 by an Au ball 33.

However, according to the above structure, it remains unchanged that the light is intercepted with the areal size for the electrode, and the luminance decreases corresponding to that. Furthermore, in the structure illustrated in FIG. 4, since current does not diffuse from the peripheral of the electrode 36, there causes a phenomenon in which only proximity of the electrode lights.

Under such circumstances, in recent years there have been some attempts to enhance the transmissivity of the electrode material up to 50% or above the preferably up to 70–80% in order to avoid the above-mentioned problems, and the light transmitting material of ITO (Indium Tin Oxide), etc., has been examined. According to this method, however, wet etching for the device isolation is hard to be applied, and hence there is no alternative but to use anisotropic etching such as RIE (Reactive Ion Etching), etc., and this method is not yet adopted as a mass-production technique because of a high cost. Furthermore, there exists a problem in terms of reliability, because that is easier to deteriorate than the conventional electrode.

SUMMARY OF THE INVENTION

It is a primary object of the present invention to provide an electrode structure which is low in price as an ohmic electrode of a semiconductor light emitting device and exhibiting a high electroluminescence efficiency from an active layer and further a high reliability, and a manufacturing method thereof.

The electrode of the semiconductor light emitting device according to the present invention involves the use of metal thin multi-layers, and introduction of oxidation for a part of elements is formed by annealing between these layers. A high conductivity and a high light transmissivity of which the electrode is demanded are attained by a multi-layer effect thereof.

Accordingly, the semiconductor light emitting device including the above-described electrode has characteristics of being high in light emitting efficiency, but low in price and having a high reliability.

Moreover, the method of manufacturing the semiconductor light emitting device according to the present invention involves forming metal multi-layers constituting an electrode, thereafter effecting annealing in an atmosphere containing oxygen and thereby providing an oxide layer between the metal layers. A stable electrode structure can be therefore obtained.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENT

Figure 5:
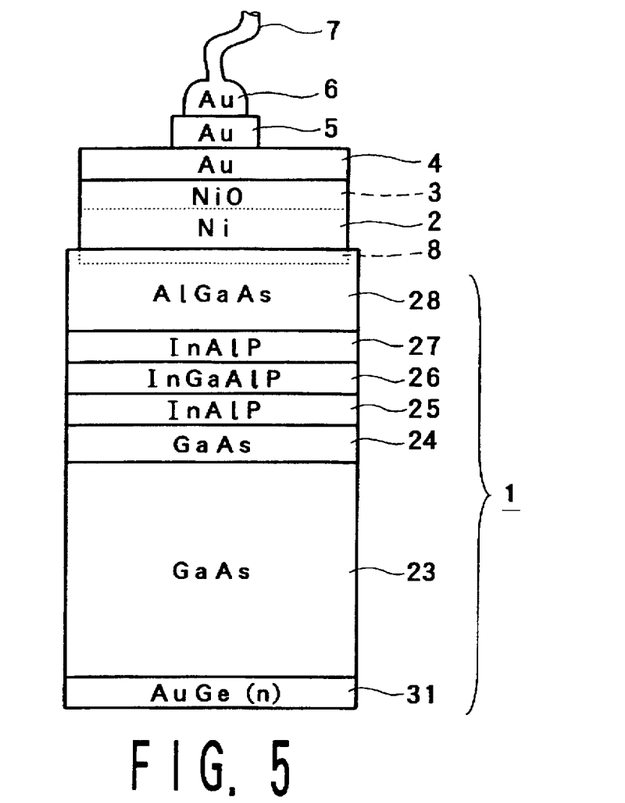
FIG. 5 is a sectional view showing one example of a structure of a semiconductor light emitting device according to the present invention.

FIG. 5 is a sectional view of one embodiment of a semiconductor light emitting device according to the present invention, especially showing a structure of an ohmic electrode.

In this semiconductor light emitting device, a pellet portion 1, as in the same way with the prior art shown in FIG.1, takes a double hetero structure, wherein an InGaAlP layer 26 and InAlP layers 25, 27 are stacked on a base layer consisting of a GaAs substrate 23 and a GaAs buffer layer 24. Then, an AlGaAs layer 28 serving as a current diffusion layer is sequentially formed by a hetero eptaxial growth, and an AuGe layer 31 defined a lower electrode is also provided.

Figure 6:
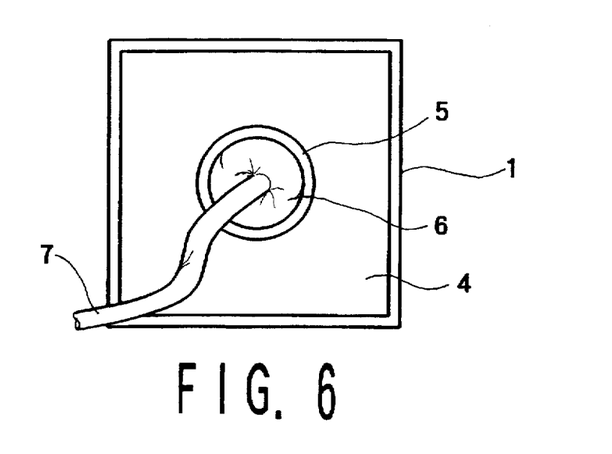
FIG. 6 is a plan view of an electrode portion in FIG. 5 as viewed from above.

An electrode is provided on an upper surface of this pellet. In this electrode, metal thin layers such as an Ni layer 2, an NiO layer 3 and an Au layer 4 are stacked in this sequence, and an Au layer 5 is proficed in a size required for bonding, on the Au layer 4. An Au wire 7 is bonded on the surface of this Au layer 5, thereby forming an Au ball 6. FIG. 6 is a plan view illustrating how of this connection is made.

Referring to FIG. 6, it can be understood that the methal thin layers 2–4 are formed substantially over the entire area of the pellet 1, and the Au layer 5 defined as a bonding pad area in which the Au ball is bonded occupies a smaller area than the metal thin layers 2–4. Further, this Au layer 5 has a thickness of approx. 0.1 μm which is thicker than other metal thin layers 2–4 each having a thickness on the order of 0.01 μm or under. The Ni layer 2 is ohmic-connected onto the pellet 1, and as a result, an Ni diffusion layer 8 is provided on a pellet uppermost layer 28. Furthermore, the Au layer 5 is formed as a buffer layer so that the pellet 1 is not damaged when bonding the Au ball 6, and as a layer for improving bondability. Further, as described above, the AuGe layer 31 is used as a lower electrode. In this case, the electrode is provided at the lower surface, in such a case, however, a light transmitting electrode is not necessarily required.

Figure 7:
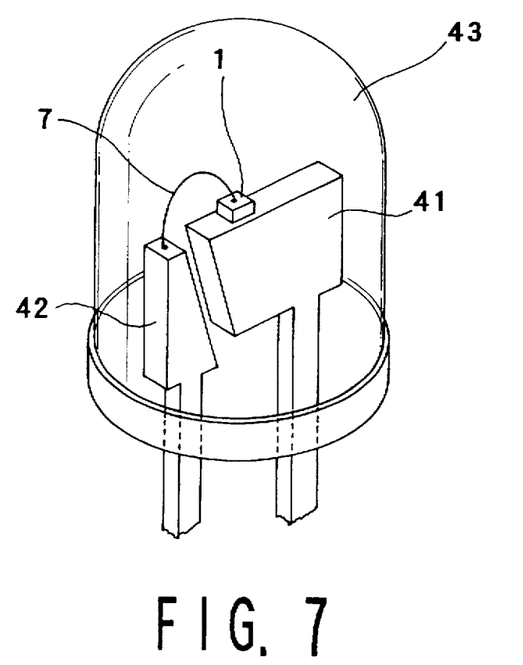
FIG. 7 is a perspective view of a light emitting device according to the present invention.

FIG. 7 is a perspective view of the light emitting diode according to the present invention. As known well, the light emitting diode pellet 1 is mounted on an upper surface of a frame 41. A gold wire 7 from an opposite frame 42 is connected to the electrode of the pellet 1. The entire structure is molded by a transparent resin to provided finished LED.

Figure 8:
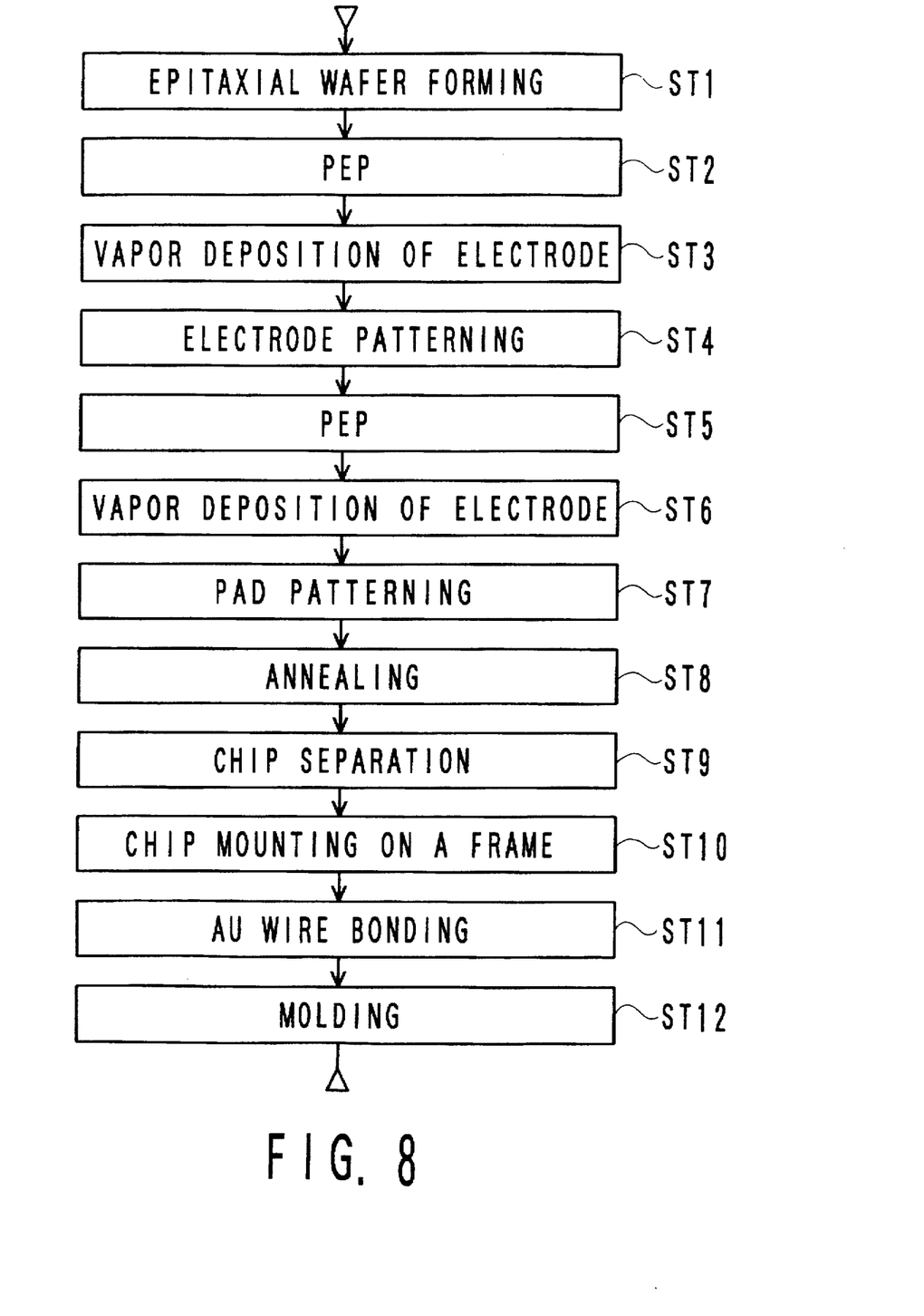
FIG. 8 is a flowchart showing a method of manufacturing the semiconductor light emitting device of the present invention.

Next, a process of manufacturing the semiconductor light emitting device shown in FIGS. 5 and 7 will be explained with reference to FIG. 8.

To start with, the InAlP layers 25, the InGaAlP layer 26, the InAlP layer 27 and the AlGaAs layer 28 are sequentially deposited on a base layer constituting of the GaAs substrate 23 and the GaAs buffer layer 24 by the epitaxial growth process (step ST1).

Thereafter, a resist is coated on the surface of the epitaxial wafer, the resist of only an electrode formation predicted area is removed by a PEP (Photo Engraving Process), thus exposing the surface of the AlGaAs layer 28 (step ST2).

The wafer in this state is set in a vapor deposition apparatus, where Ni that will becomes a metal electrode layer and subsequently Au are deposited with a residual resist serving as a deposition mask (step ST3).

The Ni layer has a thickness of 0.005 μm, while the Au layer is 0.01 μm in thickness.

Subsequently, the vapor deposited layers 2 and 4 are subjected to patterning in a predetermined configuration (step ST4).

Next, a pad 5 is formed based on a lift-off method same as steps ST2–4, the resist is removed, and extra Au film is removed (steps ST5–7).

Thereafter, the stacked structure is annealed at 600 degrees centigrade for 30 minutes in a mixed gas atmosphere in which a minute amount of oxygen is introduced into an inactive gas such as nitrogen, etc. (step ST8). An NiO layer 3 is thereby provided at a boundary between the Au layer and the Ni layer, and a stacked structure consisting of the Ni layer 2, the NiO layer 3 and the Au layer 4 is provided. Further, as will be mentioned layer, this NiO layer is good in terms of the light transmitting property and thereby brings about a remarkable enhancement of the light transmitting property of the whole electrode. Accordingly, the anneal treatment in this process performs an essential role of the present invention.

Next, a device isolation is done by dicing and side— surface etching as well (step ST9). Next, this chip is mounted on a frame with an silver paste (step ST10) and the Au wire 7 is bonded onto the Au pad 5 (step ST11). An Au ball 6 is made by this bonding.

Finally, the semiconductor light emitting device is completed by performing a resin molding process (step ST11).

In this embodiment, though the device having an $In_xGa_yAl_{1-x-y}P$ double hetero junction, a device having $In_zGa_{1-x}AlN$ double hetero junction can also be employed.

Figure 9:
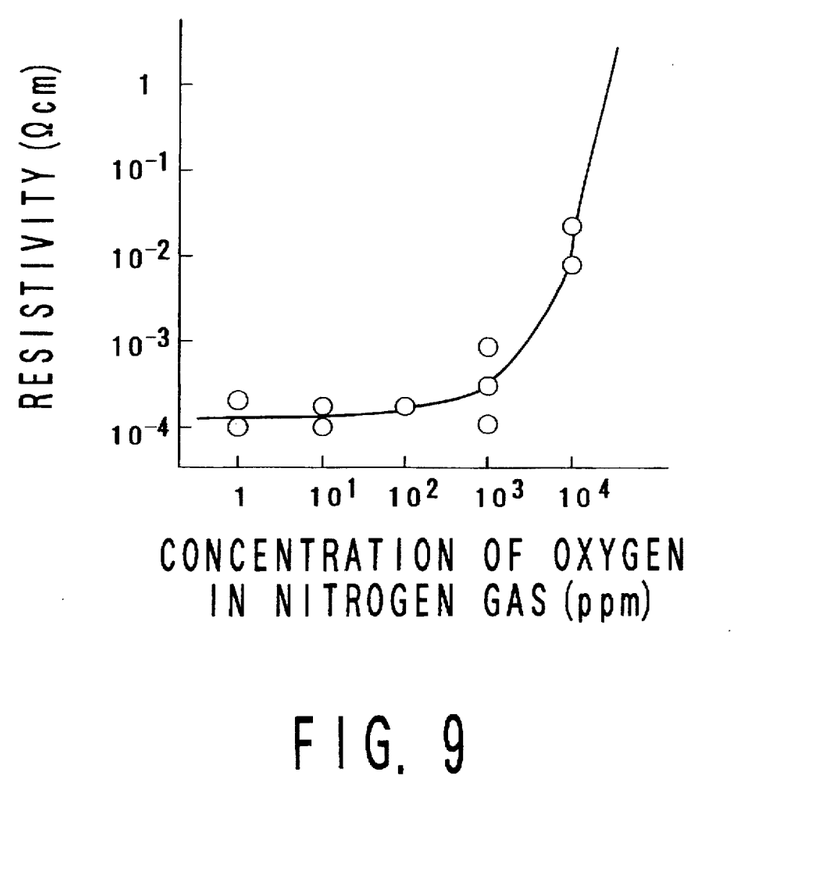
FIG. 9 is a graph showing a relationship between a resistivity with respect to the electrode of the present invention and a concentration of oxygen in an atmospheric gas.

FIG. 9 is a graph showing a relationship between a resistivity relative to the electrode according to the present invention and an oxygen concentration in the atmospheric gas. As shown in FIG. 9, a high conductivity is obtained with an oxygen concentration of 1 ppm through 100 ppm at resistivity of $10^{-3}$ Ωcm or under. This is derived from the fact that the NiO layer is neatly formed as far as a proper oxygen concentration is prepared. On the other hand, for the oxygen concentration of 1000 ppm or more, the conductivity is remarkably deteriorated. The reason is considered that the whole Ni layer is transformed to Ni oxide.

Figure 10:
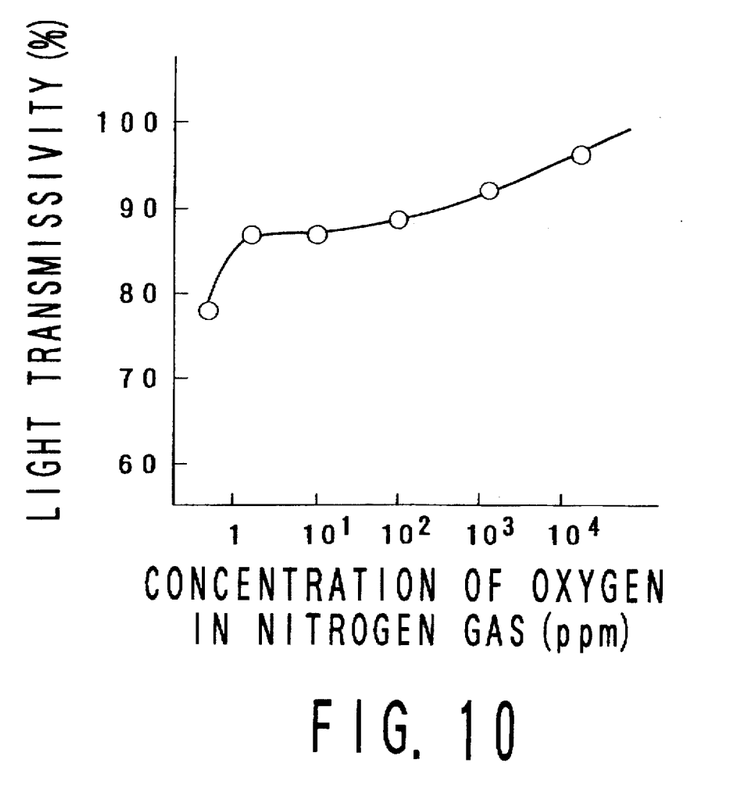
FIG. 10 is a graph showing a relationship between a light transmissivity with respect to the electrode of the present invention and the concentration of oxygen in the atmospheric gas; p

Further, FIG. 10 is a graph showing a relationship between a light transmissivity of the electrode according to the present invention and the oxygen concentration in the atmospheric gas. It can be understood that the light transmissivity (a wavelength: 0.6 μm) shown in FIG. 10 depends upon the oxygen concentration, and the light transmissivity of 80% or above is obtained with a concentration of 1 ppm or more. This is attributed to the fact that the light transmissivity of the very thin NiO layer formed under the existence of oxygen.

Accordingly, it could be known from the two graphs shown in FIGS. 9 and 10 that the conductivity and the light transmissivity are simultaneously satisfied within an oxygen concentration range between 1 and 1000 ppm.

However, the above-mentioned conditions are the optimum conditions only for an anneal condition of 600 degree 30 minutes. Accordingly, when temperature and time conditions are changed, in order to achieve the above-mentioned light transmissivity and conductivity, the oxygen concentration should be optimized.

Figure 11:
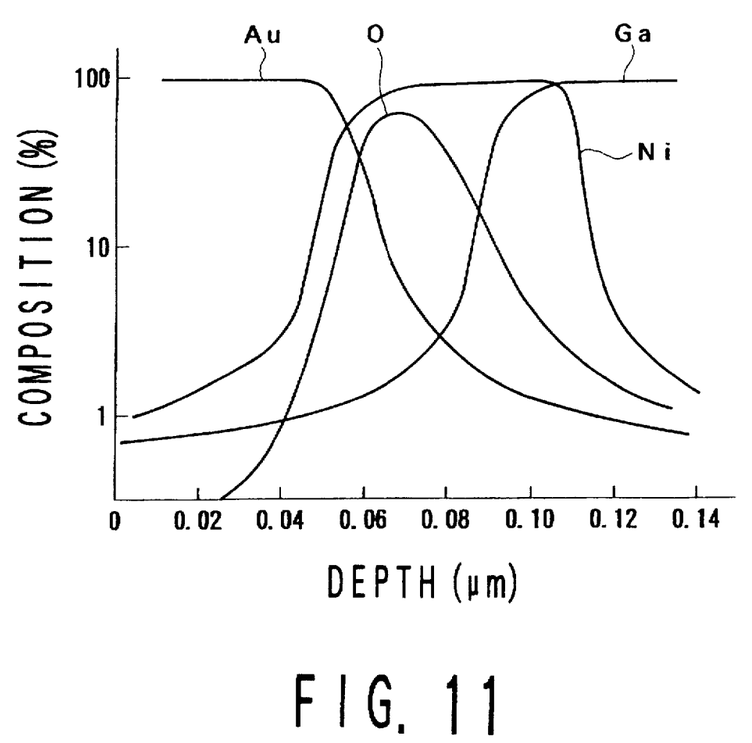
FIG. 11 is a graph showing composition profiles of respective materials constituting the electrode of the present invention.

FIG. 11 is a graph showing an oxygen concentration distribution (profile) versus depths of a variety of metal materials constituting the electrode illustrated in FIG. 4. According to this graph, the profiles of Au, Ni and O gradually increase and decrease, and hence it can be considered that boundaries between the respective layers are not definite, and the respective elements diffuse each other. Further, the interface is enriched with oxygen from the distribution concentration, and an oxide is thereby formed. It is assumed that this oxide is diffused with Au and Ni.

Figure 12:
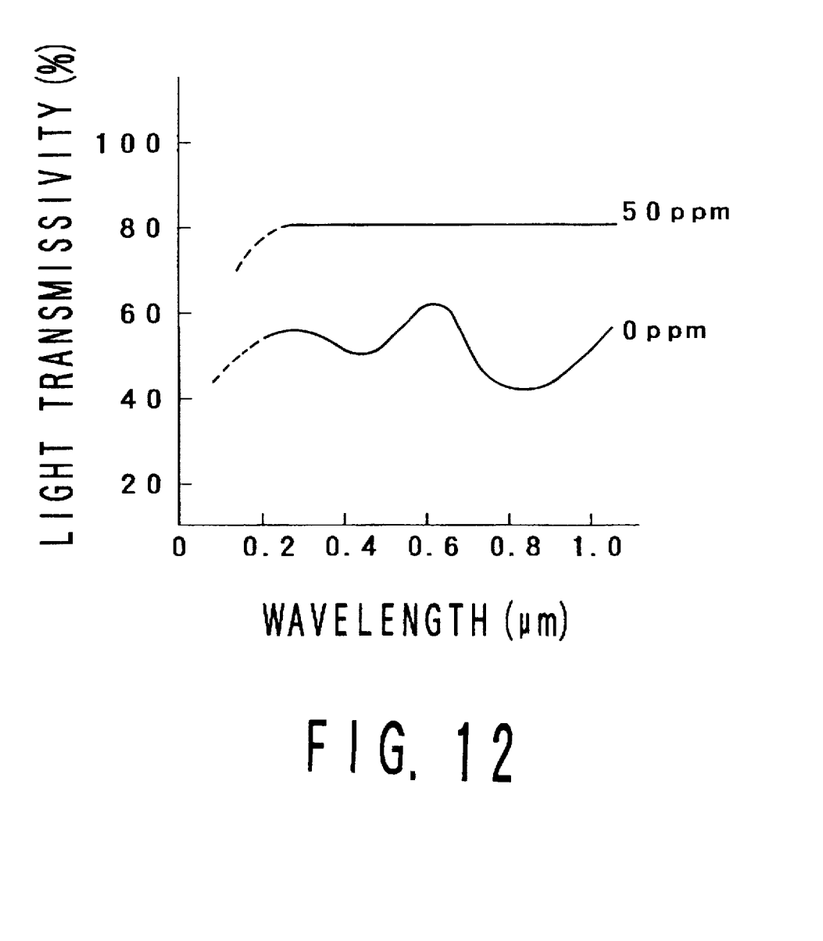
FIG. 12 is a graph showing a relationship between a wavelength of transmitting light and the light transmissivity when the oxygen concentration with respect to the electrode of the present invention is 0 ppm and 50 ppm.

FIG. 12 is also a graph showing a relationship between the light transmissivity and the wavelength of transmission light when the oxygen concentration with respect to the electrode according to the present invention is between 0 ppm and 50 ppm. It can be understood that the light transmissivity increases when contained with oxygen and becomes constant with respect to the light having a wide range of wavelengths. More specifically, as shown in FIG. 12, if annealing is carried out in the atmosphere containing no oxygen, the light transmissivity is 60% at the maximum and fluctuates from 40% up to 60% depending on the wavelengths. In contrast, when containing oxygen of 50 ppm, the light transmissivity becomes 80% or more with respect to the wavelengths of 0.2 μm to 1 μm. What is given above is an example of the thin Ni and Au layers, wherein the Ni layer is deposited in thickness on the order of 0.005 μm, and the Au layer is deposited in thickness of 0.01 μm. Even when the Ni layer thickness changes between 0.001 μm and 0.1 μm. However, the light transmissivity is substantially constant such as changing from 70% to 90%. However, the oxygen concentration in the atmospheric gas during annealing and an annealing temperature and time should be optimized.

Figure 13:
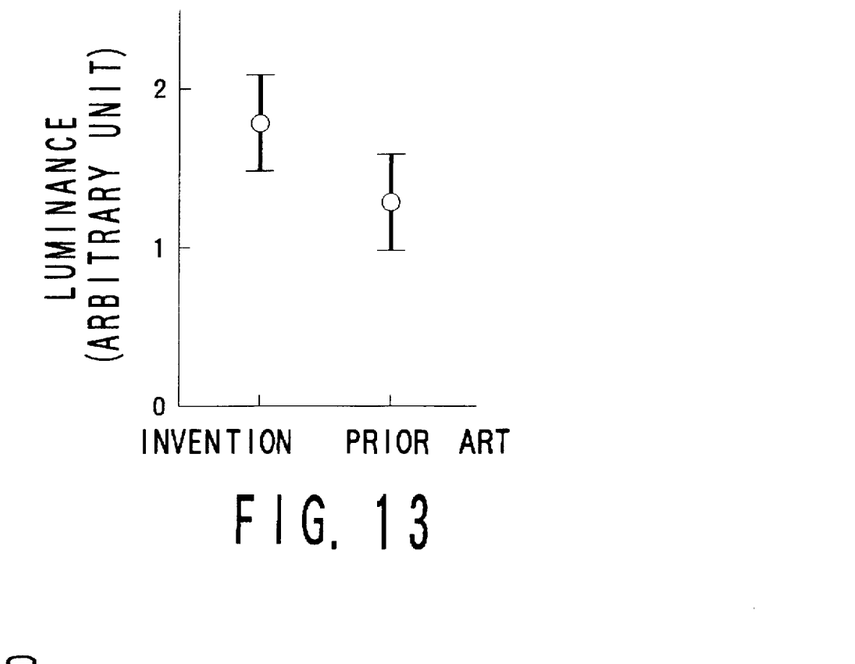
FIG. 13 is a graph showing a comparison in luminance of semiconductor light emitting devices having the electrodes between the present invention and the prior art.

FIG. 13 is a graph showing a comparison in terms of luminance when using the electrode between the present invention and the prior art. This item of data are obtained by dividing the same epitaxial wafer, respectively providing one of the divided wafers with the conventional electrode and the other one with the electrode of the present invention, and comparing light emitting efficiencies after molding them. As understood from FIG. 13, the electrode of the present invention has a luminance of approximately 50% as an absolute value higher than those of the conventional electrodes.

Figure 14:
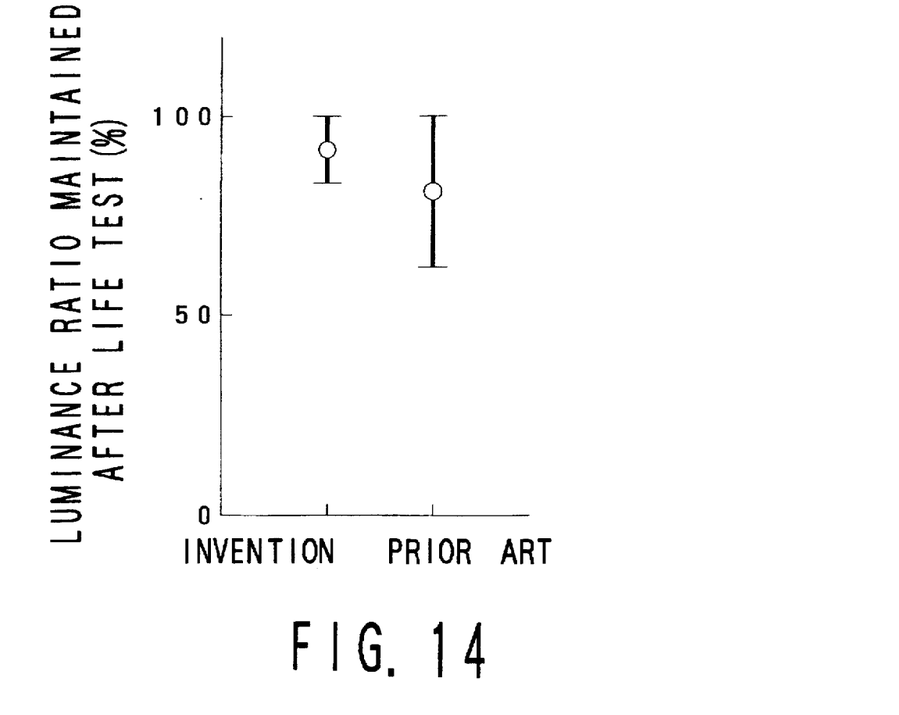
FIG. 14 is a graph showing a comparison in reliability of the semiconductor light emitting devices having the electrodes between the present invention and the prior art.

FIG. 14 is also a graph showing a comparison in reliability between cases where the electrode of the present invention and the conventional electrode are formed on the same epitaxial wafer. It can be known from this graph that the conventional electrode exhibits a 85% luminance is maintained after 1000 hours in a life test at a room temperature operation of 50 mA, while the electrode of the present invention exhibits a 95% luminance enough to decelerate deterioration and therefore has a high reliability.

Further, the electrode of the present invention is substantially the same in terms of costs as the prior art and is good in terms of reproducibility.

One embodiment of the present invention has been described so far. The present invention is, however, applicable to pellets in any designs.

Figure 15:
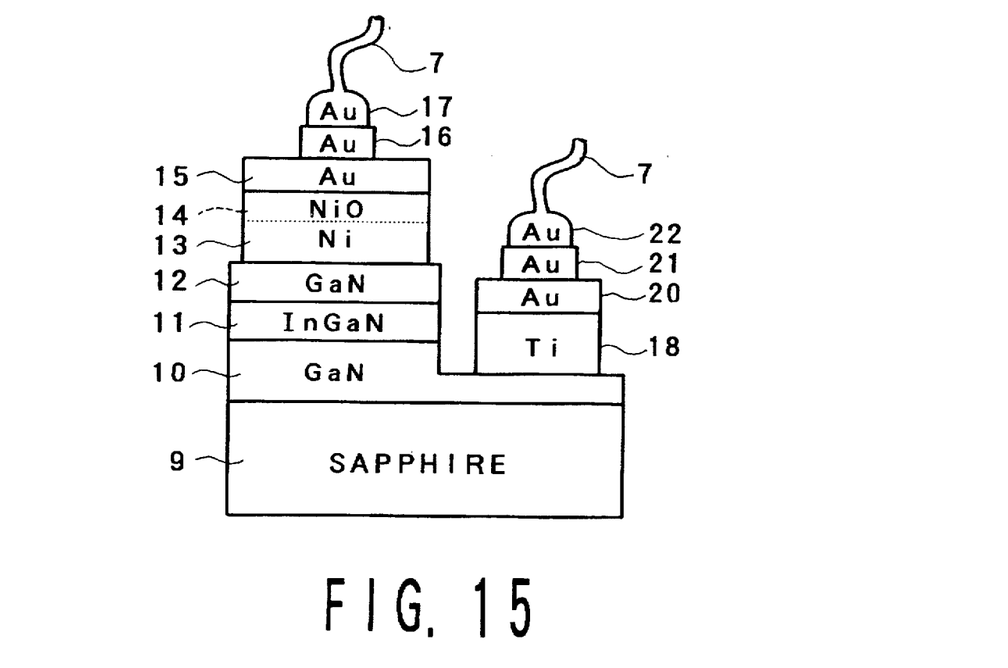
FIG. 15 is a sectional view illustrating how the present invention is applied to the semiconductor light emitting device in such a type that two electrodes are provided on the same surface.

For example, the present invention can be applied to such a type as to take the p and n type electrodes from the upper surface of the pellet as in the prior art shown in FIG. 4. The semiconductor light emitting device of the present invention, as illustrated in FIG. 15, requires forming p and n type ohmic electrodes from the surface 10, 12 because of the substrate being classified as an insulating substrate. If a GaN layer 10, an InGaN 11 and a GaN layer 12 are grown in sequence on a sapphire substrate 9. Therefore, one electrode is provided on the GaN layer 10, while the other electrode is provided on the upper surface 12 of the pellet.

In the electrode on the upper surface of the pellet, an Ni layer 13, an NiO layer 14, an Au layer 15 and an Au pad 16 are stacked in this sequence on the GaN layer 12, and a structure of this electrode is the same as that shown in FIG. 5. An Au wire 7 is bonded onto the Au pad 16, and an Au ball 17 is thereby provided. Further, in the other electrode, a Ti layer 18, an Au layer 20 and an Au pad 21 are stacked in sequence on the GaN layer 10. The Au wire 7 is also boned onto the Au pad 21 by an Au ball 22.

In the case of such a pellet, a ratio of the ohmic electrode area to the surface area increases, and therefore particularly a remarkable enhancement of the luminance can be seen by use of the light transmitting electrode of the present invention. In accordance with the embodiment discussed above, the electrode has the two-layered structure including the oxide layer interposed therebetween. The same effect, however, can be exhibited even in a multi-layered structure having three or more layers under some conditions.

More specifically, when the total metal layer thickness is 0.01 μm or less, a good light transmitting property can be recognized. Further, the good light transmitting property can be seen when the thickness of the oxide layer is 0.01 μm or under. However, is there is not oxide layer at all, the light transmitting property itself is deteriorated, and also there can be confirmed such a phenomenon that the light transmissivity at a specific wavelength is conspicuously deteriorated due to interference by the multi-layered structure.

In the case of the multi-layered structure described above, an oxide layer is formed between the metal layers close to the surface or on an easy-to-oxidize metal surface. Moreover, in accordance with the embodiment discussed above, though the combination of Au and Ni has been explained as a metal combination, the same conductivity and the same light transmissivity could be obtained with a combination of Au and Cr, a combination of Au and Al, and a combination of Au and Ti. Generally, the materials suited to the metal multi-layered structure are Au and Pt for the surface layer, which are suitable for bonding, and are Ni, In, Mg, Zn, Ge, Cr, Ti and Al for the lowermost layer, which can be combined corresponding to the layer structures so that a relationship between an electron affinity of the semiconductor layer and a metal work function enough to make a good ohmic connection to the pellet uppermost layer is established to form no Schottky barrier.

In this case, optimum values of the thermal treatment time and the oxygen concentration in the atmospheric gas are slightly different depending on the element combinations but substantially the same as those in the above-described combination of Au and Ni. Further, if the metal thin layers are multi-layered such as three layers, four layers and so on, there are less changes in the light transmissivity due to the wavelength, and desirable characteristics are obtained.

Accordingly, the light can be obtained from the whole electrode by use of the light transmitting metal multi-layered structure including the inter-layer oxygen rich layer, especially oxide layer, of the constructive metal as the electrode of the semiconductor light emitting device, and it is feasible to enhance a light fetching efficiency and the reliability, and reduce the costs.

It is apparent that, in this invention, a wide range of different working modes can be formed based on the invention without deviating from the spirit and scope of the invention. This invention is not restricted by its specific working modes except being limited by the appended claims.

What is claimed is:

1. An electrode of a semiconductor light emitting device having a structure of stacked semiconductor layers including a double hetero junction, comprising:

a plurality of stacked metal layers exhibiting a light transmitting property; and an oxygen rich layer exhibiting the light transmitting property and interposed between said metal layers.

2. The electrode according to claim 1, wherein said oxygen rich layer is an oxide film.

3. The electrode according to claim 1, wherein metal layers stacked are selected from a group of metals of Au, Pt, Ni, In, Mg, Zn, Ti, Ge, Cr and Al.

4. The electrode according to claim 3, wherein the uppermost layer of stacked metal layers is a metal suitable for bonding, and the lowermost layer of stacked metal layers is a metal easy to make an ohmic connection.

5. The electrode according to claim 4, wherein a surface layer of said semiconductor light emitting device is of a p-type, said metal layer suitable for bonding is gold layer, and said layer easy to make the ohmic connection is a nickel layer.

6. The electrode according to claim 1, wherein said each metal layer of said stacked metal layers has a thickness of 1 nm through 100 nm, and a total layer thickness of said electrode is less than 1000 nm.

7. An electrode of a semiconductor light emitting device, having an $In_xGa_yAl_{1-x-y}P$ or $In_2Ga_{1-x}AlN$ double hetero junction on a sapphire substrate a structure of stacked semiconductor layers comprising:

a plurality of stacked metal layers exhibiting a light transmitting property; and an oxygen rich layer exhibiting the light transmitting property and interposed between said metal layers.

8. The electrode according to claim 7, wherein said oxygen rich layer is an oxide film.

9. The electrode according to claim 7, wherein metal layers stacked are selected from a group of metals of Au, Pt, Ni, In, Mg, Zn, Ti, Ge, Cr and Al.

10. The electrode according to claim 7, wherein the uppermost layer of stacked metal layers is a metal suitable for bonding, and the lowermost layer of stacked metal layers is a metal easy to make an ohmic connection.

11. The electrode according to claim 10, wherein a surface layer of said semiconductor light emitting device is of a p-type, said metal layer suitable for bonding is gold layer, and said layer easy to make the ohmic connection is a nickel layer.

12. The electrode according to claim 9, wherein said each metal layer of said stacked metal layers has a thickness of 1 nm through 100 nm, and a total layer thickness of said electrode is less than 1000 nm.

13. A semiconductor light emitting device comprising:

a semiconductor light emitting device pellet having a stacked layer structure including a double hetero junction and having first and second main surfaces defined a light emitting surfaces;

a first electrode provided on said first main surface;

a second electrode provided on said second main surface;

a plurality of stacked metal layers exhibiting a light transmitting property provided on at least one of said first and second electrodes; and an oxygen rich layer exhibiting the light transmitting property and interposed between said metal layers;

a frame for supporting said semiconductor light emitting device pellet thereon;

a wire connected to said electrodes; and a sealing resinous material covering the whole.

14. The device according to claim 13, wherein said oxygen rich layer is an oxide film.

15. The electrode according to claim 13, wherein metal layers stacked are selected from a group of metals of Au, Pt, Ni, In, Mg, Zn, Ti, Ge, Cr and Al.

16. The electrode according to claim 13, wherein the uppermost layer of stacked metal layers is a metal suitable for bonding, and the lowermost layer of stacked metal layers is a metal easy to make an ohmic connection.

17. The electrode according to claim 16, wherein a surface layer of said semiconductor light emitting device is of a p-type, said metal layer suitable for bonding is gold layer, and said layer easy to make the ohmic connection is a nickel layer.

18. The electrode according to claim 13, wherein said each metal layer of said stacked metal layers has a thickness of 1 nm through 100 nm, and a total layer thickness of said electrode is less than 1000 nm.

19. A semiconductor light emitting device comprising:

a semiconductor light emitting device pellet having a semiconductor layer stacked structure including an InGaN-series double hetero junction on a sapphire substrate, a first electrode constructed of a plurality of stacked metal layers exhibiting a light transmitting property and provided on the surface of said semiconductor light emitting device pellet, an oxygen rich layer exhibiting the light transmitting property and interposed between said metal layers, and a second electrode providing on a GaN layer serving as a base layer of the InGaN-series double hetero junction that is formed on said sapphire substrate;

a frame for supporting said pellet;

a wire connected to said electrodes; and a sealing resinous material covering the whole.

20. The device according to claim 19, wherein said oxygen rich layer is an oxide film.

21. The electrode according to claim 19, wherein metal layers stacked are selected from a group of metals of Au, Pt, Ni, In, Mg, Zn, Ti, Ge, Cr and Al.

22. The electrode according to claim 19, wherein the uppermost layer of stacked metal layers is a metal suitable for bonding, and the lowermost layer of stacked metal layers is a metal easy to make an ohmic connection.

23. The electrode according to claim 22, wherein a surface layer of said semiconductor light emitting device is of a p-type, said metal layer suitable for bonding is gold layer, and said layer easy to make the ohmic connection is a nickel layer.

24. The electrode according to claim 19, wherein said each metal layer of said stacked metal layers has a thickness of 1 nm through 100 nm, and a total layer thickness of said electrode is less than 1000 nm.

* * * * *